United States Patent [19] [11] 3,824,491
Treadway [45] July 16, 1974

[54] TRANSISTOR CRYSTAL OSCILLATOR WITH AUTOMATIC GAIN CONTROL

[75] Inventor: Ronald L. Treadway, Scottsdale, Ariz.

[73] Assignee: Motorola, Inc., Franklin Park, Ill.

[22] Filed: Mar. 19, 1973

[21] Appl. No.: 342,569

[52] U.S. Cl. .............. 331/109, 331/116 R, 331/183
[51] Int. Cl. .......................... H03b 3/02, H03b 5/36
[58] Field of Search ......... 331/109, 116 R, 159, 183

[56] References Cited

UNITED STATES PATENTS 3,665,342 5/1972 Reed .................................. 331/109
3,684,981 8/1972 Kreitz ............................. 331/116 R

*Primary Examiner*—Herman Karl Saalbach
*Assistant Examiner*—Siegfried H. Grimm
*Attorney, Agent, or Firm*—Vincent J. Rauner; Henry T. Olsen; Maurice J. Jones

[57] ABSTRACT

A crystal controlled oscillator operable over a wide frequency range includes an emitter coupled oscillator and automatic gain control to maintain the amplitude of the oscillations within a predetermined range to limit crystal drive and to provide a substantially sinusoidal output signal without additional tuned circuits.

7 Claims, 1 Drawing Figure

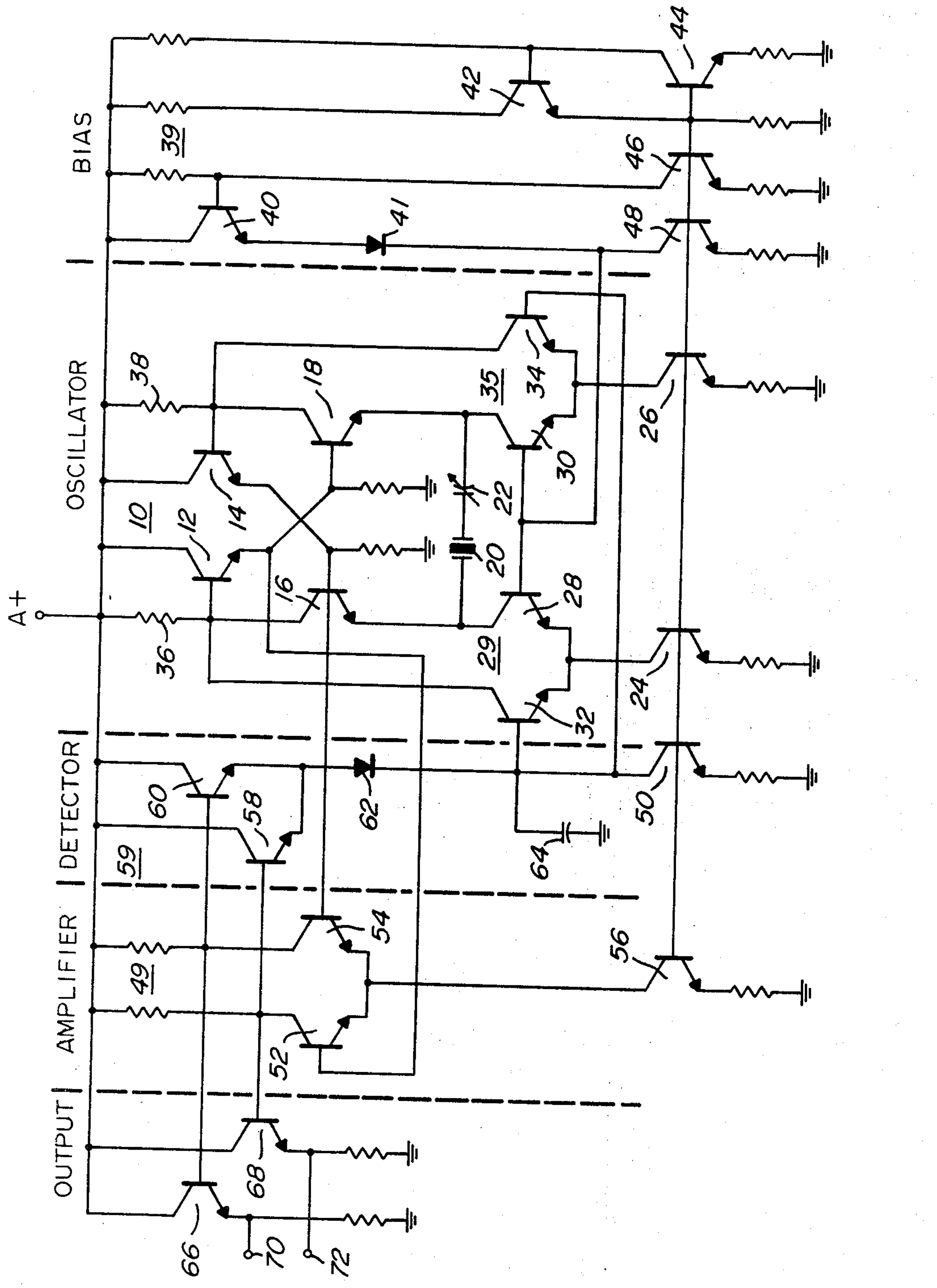
BIAS
39
OSCILLATOR
10
DETECTOR
59
AMPLIFIER
49
OUTPUT
A+
12
14
16
18
20
22
24
26
28
29
30
32
34
35
36
38
40
41
42
44
46
48
50
52
54
56
58
60
62
64
66
68
70
72

TRANSISTOR CRYSTAL OSCILLATOR WITH AUTOMATIC GAIN CONTROL

BACKGROUND

1. Field of Invention

This invention relates generally to oscillator circuits, and more particularly to integrated radio frequency sine wave oscillators.

There are many applications wherein it is necessary to provide a sinusoidal radio frequency signal having a stable oscillation frequency. One such application for such an oscillator is as a reference oscillator for a radio transmitter or a local oscillator for a radio receiver. Another such application is as a reference frequency oscillator for digital equipment.

2. Prior Art

Several techniques for providing a sinusoidal oscillator are known. Such systems generally employ an amplifier having a feedback loop which includes a frequency determinative element, such as, for example, a tuned circuit or a piezoelectric crystal.

Whereas these systems provide a way to achieve a sinusoidal oscillator, in circuits of the prior art, the gain of the amplifier must be relatively high to assure start up of the oscillator. As a result of the high gain, the output signal of the oscillator is not sinusoidal due to the limiting action of the amplifier, and a tuned tank circuit is required to achieve a sinusoidal output signal. However, in many applications, such as applications wherein the oscillator must operate over a wide range of frequencies, or in integrated circuit applications wherein a tuned tank circuit cannot be readily fabricated, the tuned circuit seriously limits the circuit design. In addition, when a piezoelectric resonator is used as the frequency determining element in the oscillators of the prior art, the high gain amplifier applies significant power to the resonator, thereby causing premature resonator aging and comprising the stability of the oscillator.

SUMMARY

It is an object of the present invention to provide an improved oscillator circuit capable of producing sinusoidal oscillations over a broad band of frequencies.

It is a further object of this invention to provide an oscillator circuit that provides a substantially sinusoidal output signal without the use of a tuned circuit for filtering the output signal.

It is another object of this invention to provide a crystal controlled oscillator having reduced power dissipation in the crystal and improved stability.

A still further object of this invention is to provide an oscillator circuit that can be readily manufactured in integrated circuit form.

In accordance with a preferred embodiment of the invention, an emitter coupled oscillator utilizing a differential amplifier having a frequency determinative network coupling the emitters of the differential amplifier transistors is employed as the basic oscillator. An amplifier and detector circuit is connected to the oscillator to sense the amplitude of the oscillations. The detector circuit provides control signals to a current shunting differential amplifier which shunts current away from the oscillator differential amplifier to reduce the gain thereof when the amplitude of the oscillations exceeds a predetermined level. The amplifier, detector and gain limiting amplifier serve as an automatic gain control circuit to maintain the operation of the oscillator within a linear region to maintain the output signal substantially sinusoidal, and to limit the power applied to the frequency determining element.

DESCRIPTION OF THE DRAWING

The single FIGURE is a schematic circuit diagram of a preferred embodiment of the sinusoidal oscillator according to the invention.

DETAILED DESCRIPTION

Referring to the FIGURE, the oscillator 10, a major portion of which can be built in integrated circuit form, comprises transistors 12, 14, 16 and 18 which are cross coupled such that the emitters of transistors 12, 14 are connected to the bases of transistors 18, 16, respectively, and the collectors of transistors 16, 18 are connected to the bases of transistors 12, 14, respectively. The emitters of the transistors 16, 18 are connected together by means of a frequency determining network, in this embodiment, a piezoelectric crystal 20 and a capacitor 22. Bias for the oscillator circuit is provided by a pair of current source transistors 24, 26 which are connected to the emitters of transistors 16, 18 through transistors 28, 30, respectively. A pair of transistors 32, 34 are emitter coupled to the transistors 28, 30, respectively, to form differential amplifiers 29, 35 therewith. The collectors of transistors 32, 34 are connected to a pair of resistors 36, 38, respectively. The resistors 36, 38 are also connected to the collectors of the transistors 16, 18 to the bases of the transistors 12, 14, respectively, and to the power supply A+. Bias for the constant current source transistors 24, 26 and the differential amplifiers 29, 35 is provided by a bias network 39 comprising a diode 41 and transistors 40, 42, 44, 46, 48 and 50. Although a particular bias network is shown, the bias network may be of any configuration that provides the required bias voltages for the oscillator. A differential amplifier 49 comprising transistors 52, 54 and a current source transistor 56 is connected to the oscillator 10 such that the bases of the transistors 52, 54 are connected to the emitters of the transistors 12, 14 to receive complementary oscillations therefrom. The output of the amplifier 49 at the collectors of transistors 52, 54 is connected to the bases of transistors 58, 60 of a detector circuit 59. The detector circuit 59 further includes a diode 62 having an anode connected to the emitters of the transistors 58, 60 and a filter capacitor 64, which is generally not part of the integrated circuit, connected to the cathode of the diode 62. The output of the detector circuit at the junction of diode 62 and capacitor 64 is connected to the bases of the transistors 32 and 34 of the differential amplifiers 29 and 35, respectively. The bases of a pair of emitter follower transistors 66, 68 are connected to the output of the amplifier 49, and the emitters of the transistors 66, 68 are connected to a pair of complementary output points 70, 72 to form an output isolation circuit between the amplifier 49 and the output points 70, 72.

In operation, the transistors 12, 14 provide a positive feedback path between the transistors 16, 18. For example, as the transistor 16 begins to conduct, the collector voltage thereof begins to fall. This drop in collector voltage is coupled through the transistor 12 to the base of the transistor 18, causing the transistor 18 to conduct less. The reduced conduction of transistor 18 causes the collector voltage thereof to rise, and the rising collector voltage is coupled to the base of the transistor 16 through the transistor 14, thereby causing transistor 16 to conduct harder. The feedback path is completed between the emitters of transistors 16 and 18 through the frequency determining circuit comprising the crystal 20 and capacitor 22, which provides a low impedance between the emitters at its resonant frequency, thereby sustaining oscillation at the resonant frequency of the frequency determinative network. The output signal from the oscillator is amplified by the amplifier 49 and complementary phase output signals are applied to the terminals 70 and 72 by the emitter follower transistors 66 and 68.

The output signals from the amplifier 49 are also applied to the rectifying diode 62 through the gain control transistors 58 and 60. The signals applied to the diode 62 are rectified thereby and filtered by the capacitor 64 to provide a direct current voltage across the capacitor 64 that has a level proportional to the amplitude of the alternating current signal from the oscillator 10. As the voltage across the capacitor 64 increases, the forward bias voltage applied to the transistors 32 and 34 by the detector circuit is increased, causing the transistors 32 and 34 to conduct more current. Since the transistors in the amplifiers 29 and 35 each share a common current source, namely the current source transistors 24 and 26, an increase in the current drawn by the transistors 32 and 34 causes a corresponding decrease in the current drawn by the transistors 28 and 30. Hence, as the amplitude of the alternating current signal from the oscillator 10 increases, the current flowing through the oscillator transistors 16, 18 as the result of current flow through the transistors 28, 30 decreases. As a result, the maximum current excursion through the transistors 16, 18 as a result of oscillation decreases. The resulting decrease in current excursion through the transistors 16, 18 results in a decrease in the current excursion through the resistors 36, 38 thereby reducing the alternating current voltage swing thereacross, and hence the output voltage of the oscillator.

Although the alternating current component of the voltage across the resistors 36, 38 decreases as a result of the decreased current flowing through the transistors 16, 18, the direct current voltage across the aforesaid resistors remains constant, thereby maintaining the bias voltage applied to the transistors 12, 14 unaffected. The current through the resistor 36 is determined by the sum of the currents flowing through the transistor 32 and the series combination of transistors 16 and 28. Since any change in the magnitude of the current flowing through the transistor 32 is accompanied by an opposite change in the magnitude of the current flowing through the series combination of transistors 16 and 28, the total current flowing through the two parallel branches remains substantially constant, thereby maintaining a substantially constant bias current through the resistor 36. The current through the resistor 38 is maintained constant for the similar reasons, and the bias voltages applied to the oscillator 10 are maintained substantially constant regardless of the proportion of the current shunted by the transistors 32 and 34.

By appropriately choosing the amount of current shunted by the transistors 32 and 34, the gain of the oscillator 10 can be adjusted to assure that the oscillator 10 operates in a linear region to provide a substantially sinusoidal output signal, thereby eliminating the need for external filtering circuits, such as tank circuits, to remove undesired harmonics from the output signal. With the exception of the frequency determining network, all circuits in the amplifier are broadband and the frequency of the oscillator may be readily changed by simply changing the frequency determining network. The circuit of the instant invention has been operated over a frequency range of more than one decade without changing any components other than the frequency determining network.

Although a particular embodiment of the oscillator according to the invention has been shown, it should be noted that any embodiment employing the concepts described in the foregoing falls within the scope and spirit of the invention.

I claim:

1. An oscillator circuit including in combination:

amplifier means with first and second transistor means each having input, output, and common electrodes, said output electrode of said first transistor means being coupled to the input electrode of said second transistor means and said output electrode of said second transistor means being coupled to said input electrode of said first transistor means;

frequency determining means coupling said common electrodes together and causing said amplifier means to generate electrical oscillation having a frequency determined by the frequency determining means;

sensing means coupled to said amplifier means for sensing the amplitude of said oscillations and generating control signals in response thereto; and gain adjusting means coupled to said sensing means and to said amplifier means for varying the current through a portion of said amplifier means in response to said control signals to maintain the amplitude of said oscillations within a predetermined range.

2. An oscillator circuit as described in claim 1 wherein said gain adjusting means is connected in a series circuit with the output and common electrodes of one of said first and second transistor means for varying the current through the transistor means connected thereto.

3. An oscillator as recited in claim 2 wherein said gain adjusting means is further connected in a series circuit with the output and common electrodes of the other of said first and second transistor means.

4. An oscillator circuit as recited in claim 2 wherein said gain adjusting means further includes current diverting means connected to the output electrode of one of said transistor means to provide a current path in parallel with said one transistor means for maintaining the direct current voltage at the output electrode substantially constant when the current through said one transistor means is varied.

5. An oscillator circuit as recited in claim 4 wherein said gain adjusting means includes a differential amplifier having first and second transistors each having base, collector and emitter electrodes, said emitter electrodes being coupled to each other, and one of said base electrodes being coupled to said sensing means and receiving control signals therefrom, the collector electrode of said first transistor being coupled to the output electrode of said one of said transistor means to provide said parallel current path, said second transistor being connected in series with said one transistor means and varying the current therethrough.

6. An oscillator circuit as recited in claim 1 wherein said sensing means includes a differential amplifier.

7. An oscillator circuit as recited in claim 1 wherein said frequency determining means includes a piezoelectric resonator.

* * * * *